(12) United States Patent
Ribeyron

(10) Patent No.: US 8,188,364 B2
(45) Date of Patent: May 29, 2012

(54) HETEROJUNCTION PHOTOVOLTAIC CELL WITH DUAL DOPING AND METHOD OF MANUFACTURE

(75) Inventor: Pierre Jean Ribeyron, Saint Ismier (FR)

(73) Assignee: Commissariat a L'Energie Atomique, Paris (FR)

( * ) Notice: Subject to any disclaimer, the term of this patent is extended or adjusted under 35 U.S.C. 154(b) by 443 days.

(21) Appl. No.: 12/570,781

(22) Filed: Sep. 30, 2009

(65) Prior Publication Data

US 2010/0084012 A1    Apr. 8, 2010

(30) Foreign Application Priority Data

Oct. 2, 2008   (FR) ...................... 08 56669

(51) Int. Cl.
  *H01L 31/00* (2006.01)
(52) U.S. Cl. ......... 136/252; 136/255; 136/258; 136/261
(58) Field of Classification Search .................... 136/261
  See application file for complete search history.

(56) References Cited

U.S. PATENT DOCUMENTS

| | | | |
|---|---|---|---|
| 6,670,542 B2 | 12/2003 | Sakata et al. | |
| 2001/0029978 A1* | 10/2001 | Nakai et al. | 136/258 |
| 2004/0182433 A1 | 9/2004 | Terakawa et al. | |
| 2008/0023068 A1 | 1/2008 | Nakashima et al. | |

OTHER PUBLICATIONS

Toru Sawada, et al. "High-Efficiency a-Si/c-Si Heterojunction Solar Cell," World Conference on Photovoltaic Energy, XP 000680063, IEEE, Dec. 5, 1994. pp. 1219-1226. ISBN: 978-0-7803-1460-3.

* cited by examiner

*Primary Examiner* — Jennifer Michener
*Assistant Examiner* — Miriam Berdichevsky
(74) *Attorney, Agent, or Firm* — Oblon, Spivak, McClelland, Maier & Neustadt, L.L.P.

(57) ABSTRACT

The invention concerns a photovoltaic cell comprising a heterojunction between a crystalline semiconductor substrate (210) of first conductivity type and a first amorphous layer (220) in the same semiconductor material and of a second conductivity type opposite the first type and having a dopant concentration of between $1.10^{19}$ and $1.10^{22}$ atoms/cm$^3$. The photovoltaic cell further comprises a second amorphous layer (225) of same conductivity type as the first layer and having a dopant concentration of between $1.10^{16}$ and $1.10^{18}$ atoms/cm$^3$, said second layer being deposited directly on a first face of the substrate and being coated with said first layer. Finally, on a second face of the substrate opposite the first face, the cell comprises a third amorphous layer (260), in the same material as the substrate and of same conductivity type with a dopant concentration of between $1.10^{19}$ and $1.10^{22}$ atoms/cm$^3$.

10 Claims, 4 Drawing Sheets

HETEROJUNCTION PHOTOVOLTAIC CELL WITH DUAL DOPING AND METHOD OF MANUFACTURE

TECHNICAL AREA

The present invention generally concerns the area of photovoltaic cells and more particularly the area of photovoltaic cells with a heterojunction of amorphous/crystalline type.

STATE OF THE PRIOR ART

A photovoltaic cell is generally based on a junction between a p-type semiconductor and an n-type semiconductor. It is recalled that in said cell, the incident photons generate electron-hole pairs in the semiconductor which are then separated by the electric field present in the space-charge region. The charge carriers thus separated are collected by collecting electrodes arranged on the front and back surfaces of the cell.

Among photovoltaic cells, a distinction is conventionally made between those with a homojunction in which the semiconductors forming the junction are materials of identical composition and atomic structure, and those with a heterojunction in which these semiconductors are materials of different composition and/or atomic structure.

One particular case of a heterojunction photovoltaic cell concerns a junction between a monocrystalline semiconductor having a first type of conductivity, and an amorphous layer of the same semiconductor having a second type of conductivity opposite the first.

Amorphous silicon (a-Si)/monocrystalline silicon (mono-Si) or amorphous silicon (a-Si)/polycrystalline silicon (poly-Si) heterojunction photovoltaic cells have been the subject of considerable research in recent years. One of the main lines of research has focused on improving the yield of photoelectric conversion, this yield being limited in particular by the recombination of electron-hole pairs at the interface. The boundaries between the grains of polycrystalline silicon or the defects of amorphous silicon set up localized surface states in the band gap and form recombination sites for electron-hole pairs.

One photovoltaic cell structure with a-Si/mono-Si or poly-Si heterojunction able to reduce the recombination rate of the carriers was proposed in document U.S. Pat. No. 5,213,628 and is illustrated FIG. 1A. This cell 100, between the monocrystalline (or polycrystalline) substrate 110 of n-type and the amorphous silicon layer 120 of p-type, comprises a thin intrinsic silicon layer 125 having a thickness of less than 250 Å. The intrinsic amorphous silicon layer being of better quality than a layer of doped amorphous silicon, the recombination rate is lower therein and therefore the cell's yield of photoelectric conversion is higher.

The upper surface of the layer is conventionally coated with a transparent conductive layer 130, in ITO for example (Indium Tin Oxide), on which the collecting electrodes 140 are arranged. The ITO layer, 130, is exposed to light. The lower face of the substrate is also coated with a back electrode, 180, in aluminium for example.

Outside the space-charge region at the PN junction, in which the transport of the carriers is essentially due to the electric field, transport within the substrate is governed by diffusion. In this case, the majority and minority carriers are no longer efficiently separated and recombination may occur at the back electrode. As a remedy, it is known to deposit a highly doped layer on the back face of the substrate, having the same type of conduction as this substrate. The field set up at the interface between this doped layer and the substrate, also called BSF for Back Surface Field, repels the minority carriers back towards the PN junction and thereby reduces the rate of recombination at the back electrode.

One example of a heterojunction photovoltaic cell with BSF field is described in document U.S. Pat. No. 5,705,828 and is schematically illustrated FIG. 1B. Parts which are identical to those in FIG. 1A carry the same reference numbers. The structure of the cell differs from that in FIG. 1A in that an $N^+$-doped amorphous silicon layer, 160, is present on the back face of the substrate. As at the front face, the recombination rate at the interface with the substrate can be reduced by inserting an intrinsic a-Si layer, 165, of 20 to 400 Å between the substrate and the doped a-Si layer 160.

Depositing of the a-Si layers 125 and 265 on the substrate is performed at relatively low temperature. It is therefore difficult to remove completely the water and organic matter present on the substrate before depositing. As a result there are impurities, chiefly oxygen at the interfaces between these layers and the substrate. To compensate for the parasitic doping due to these N-type impurities, application EP-A-1320134 proposes incorporating a minimum quantity of P dopant (boron) at these interfaces.

Although this technique allows an improvement in the open-circuit voltage of the cell by passivating the surface states at the interfaces between layers 125, 165 and the substrate, it is relatively complex insofar as it requires the forming of three separate layers of amorphous silicon on each of the faces of the substrate. In addition, the addition of a small quantity of dopant at the interfaces is difficult to control. Finally, the Fill Factor (FF parameter), of said cell is not very good. It is recalled that the parameter FF gives the difference between a real characteristic of the cell and an ideal rectangular characteristic. More precisely, it is defined as the ratio $$FF = \frac{P_{opt}}{I_{cc}V_{co}}$$

in which $P_{opt}$ is the power supplied by the cell at the optimal power point of the characteristic (maximum current and voltage), $I_{cc}$ is the short-circuit current and $V_{co}$ is the open-circuit voltage.

One first object of the present invention is to propose a structure for a heterojunction photovoltaic cell of amorphous/crystalline type, with or without a BSF field, having a low surface state density at the interface and which can be produced more easily than in the prior art.

A second objective of the present invention is to improve the fill factor of the cell characteristic, whilst maintaining a high open-circuit voltage.

DESCRIPTION OF THE INVENTION

The present invention is defined by a photovoltaic cell comprising a heterojunction between a crystalline semiconductor substrate of first conductivity type and a first amorphous layer on a first face of the substrate, in the same semiconductor material and having a second type of conductivity opposite the first and a doping level of between $1.10^{19}$ and $1.10^{22}$ atoms/cm$^3$, the second face of the substrate opposite the first being coated with a third amorphous layer in the same material as the substrate and of the same conductivity type with a dopant concentration of between $1.10^{19}$ and $1.10^{22}$ atoms/cm$^3$. This cell further comprises a second amorphous layer having the same type of conductivity as the first layer and having a dopant concentration of between $1.10^{16}$ et $1.10^{18}$ atoms/cm$^3$, said second layer being deposited directly on the first face of the substrate and being coated by said first layer.

According to a first variant, the doping in the first and second layers is gradual, the dopant concentration increasing in a direction leading from the second layer towards the first layer.

According to a second variant, the dopant concentration in each of the first and second layers is constant.

The thickness of the first layer is typically less than 50 nm, and the thickness of the second layer is less than 10 nm.

Advantageously, according to a second embodiment, the photovoltaic cell further comprises a fourth amorphous layer in the same semiconductor material as the substrate and having the same first type of conductivity, said fourth layer being deposited directly on the second face of the substrate and being coated with said third layer.

According to a first variant of the second embodiment, the doping in the third and fourth layers is gradual, the dopant concentration increasing in a direction leading from the fourth layer towards the third layer.

According to a second variant of the second embodiment, the level of doping in each of the third and fourth layers is constant.

Typically, the thickness of the third layer is less than 50 nm, and the thickness of the fourth layer is less than 10 nm.

Advantageously, said first layer is coated with a first transparent conductive oxide layer on which first collecting electrodes are arranged.

Similarly, said third layer may be coated with a second transparent conductive oxide layer, on which second collecting electrodes are arranged.

BRIEF DESCRIPTION OF THE DRAWINGS

Other characteristics and advantages will become apparent on reading a preferred embodiment of the invention, given with reference to the appended figures amongst which.

DETAILED DESCRIPTION OF PARTICULAR EMBODIMENTS

Consideration will again be given to a heterojunction photovoltaic cell structure of amorphous/crystalline type. Said cell comprises a poly- or monocrystalline semiconductor substrate, typically monocrystalline silicon of a first type of conductivity, on which a layer of the same semiconductor in amorphous phase is deposited, typically a-Si, having a second type of conductivity opposite the first.

Figure 1A:
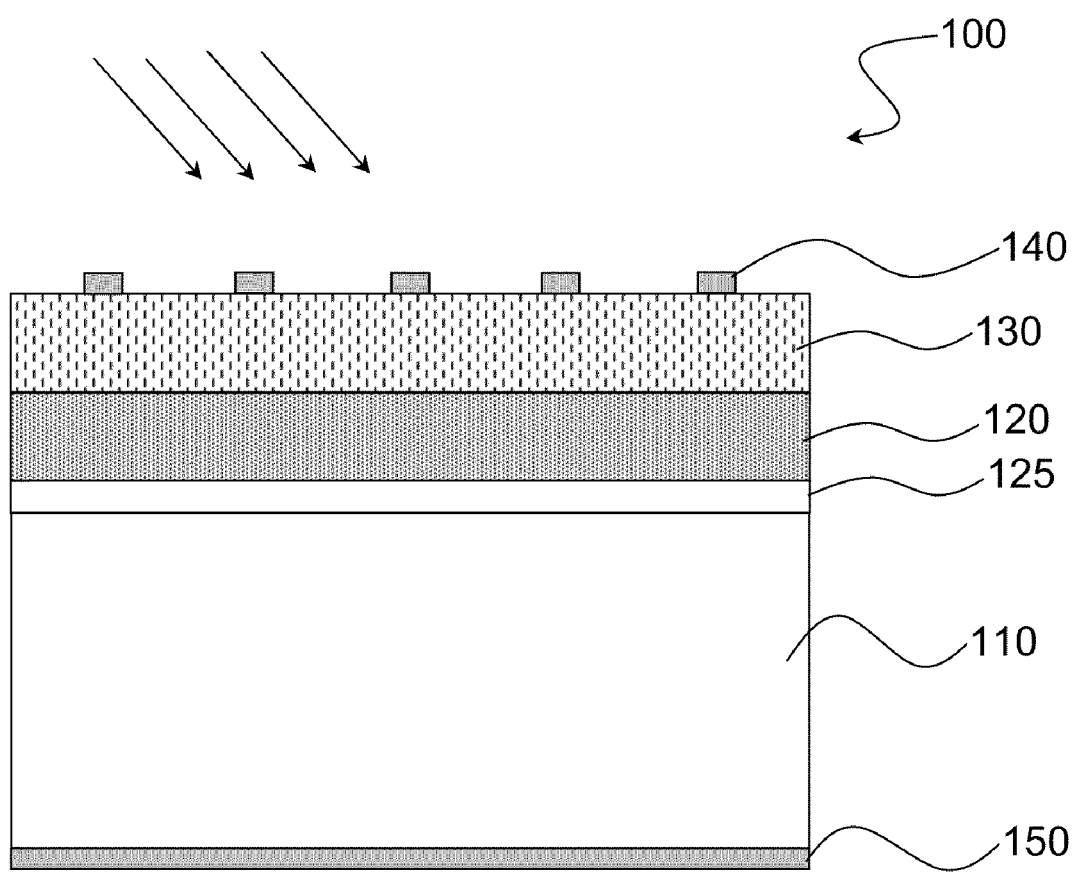
FIG. 1A is a diagram of a first photovoltaic cell structure known in the state of the art.
Figure 1B:
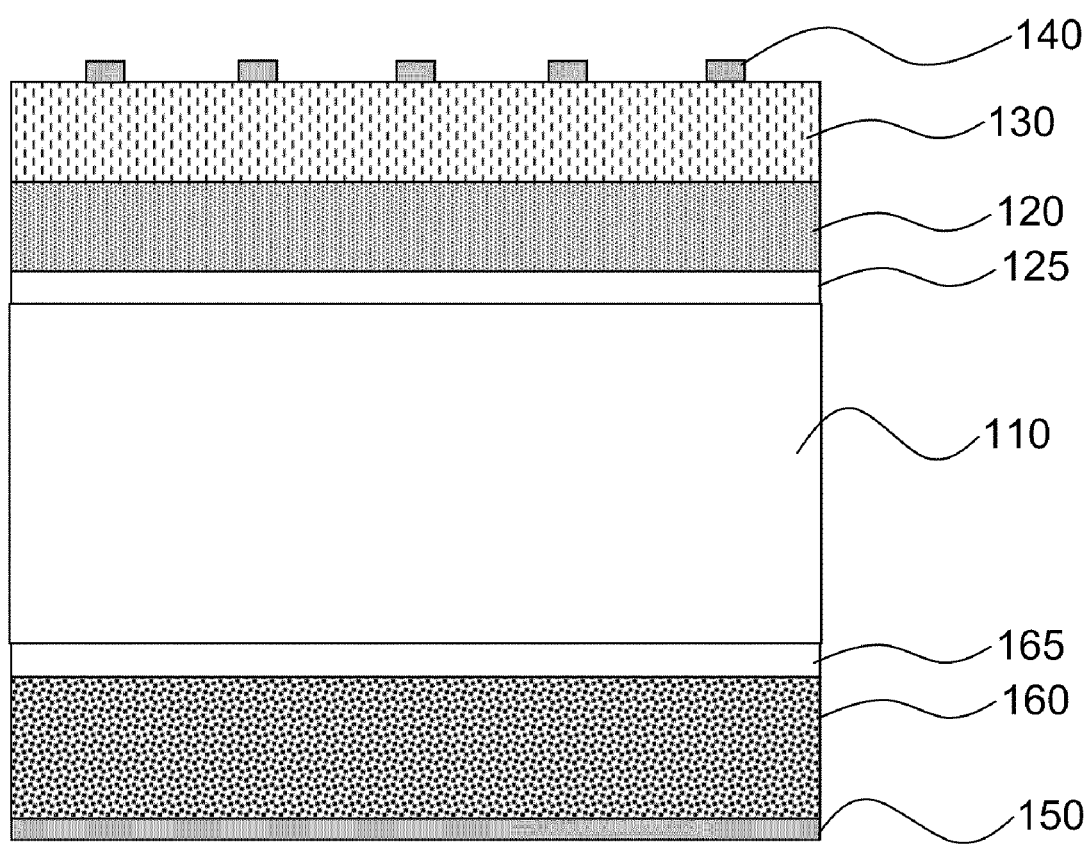
FIG. 1B schematically illustrates a second photovoltaic cell structure known in the state of the art.
Figure 2A:
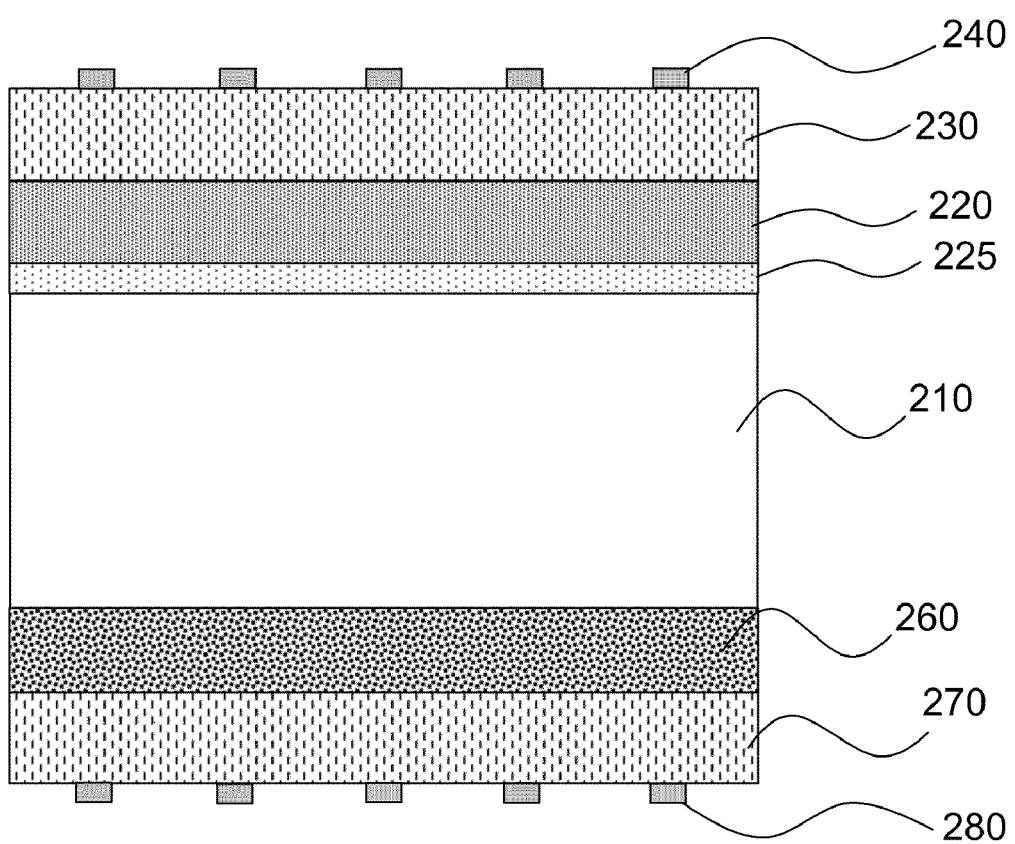
FIG. 2A schematically illustrates a photovoltaic cell structure according to a first embodiment of the invention.

FIG. 2A illustrates the structure of a photovoltaic cell according to a first embodiment of the invention.

The crystalline semiconductor substrate, e.g. a wafer of N-type monocrystalline silicon, is denoted 210. The thickness of the substrate 210 is in the order of a few hundred microns.

The amorphous semiconductor layer, of opposite type to that of the substrate e.g. P$^+$-doped a-Si, is referenced 220. The dopant concentration of this first amorphous layer 220 lies between $1.10^{19}$ et $1.10^{22}$ at/cm$^3$ and its thickness is typically 6 to 20 nm and more generally less than 50 nm.

Unlike in the prior art, a second amorphous layer 225, weakly doped and of the same type as the first, is directly deposited on the substrate, before the depositing of the amorphous layer 220. The dopant concentration of the second amorphous layer lies between $1.10^{16}$ and $1.10^{18}$ at/cm$^3$, i.e. substantially lower than the doping concentrations currently used, in which case the expression microdoped is conventionally used. The thickness of layer 225 typically ranges from 2 to 4 nm, and more generally it is less than 10 nm.

The microdoped second amorphous layer 225, has twofold interest. Firstly, through its low doping level, it allows low localized surface state density to be obtained, and hence a low rate of recombination of the carriers at the interface and a high $V_{co}$ value, similar to an intrinsic amorphous layer. Additionally, the conductivity of the microdoped amorphous layer is substantially higher than with an intrinsic layer, which reduces series resistance of the cell and substantially improves its fill factor.

The amorphous layer 220 is coated with a transparent, conductive oxide layer 230, in ITO (Indium Tin Oxide) for example. An interdigited electrode 240, in silver for example, is used to collect the majority carriers (here the holes) on the upper surface of the cell. This upper surface is exposed to light radiation.

The lower face of the substrate 210 is coated with a back electrode 280, optionally after depositing a third layer 260 in the same amorphous material as the substrate and having the same conductivity (N$^+$-doped a-Si) with a dopant concentration of $10^{19}$ to $10^{22}$ at/cm$^3$ to ensure good collection of the majority carriers, then with a transparent conductive oxide layer 270 e.g. ITO. The thickness of the third layer is typically between 12 and 30 nm. The thickness of the ITO layer is between 75 and 100 nm for example.

According to a first variant, the dopant concentration is constant in each of the amorphous layers, the dopant concentration in the first amorphous layer, as already mentioned, being substantially higher than in the second amorphous layer directly in contact with the substrate.

According to a second variant, the dopant concentration is gradual across these two layers and increase in the direction leading from the second amorphous layer 225 towards the first amorphous layer 220. This second variant is advantageous insofar as the doping gradient sets up an electric field in these layers, which allows easier extraction of the majority carriers (here the holes) and which opposes the diffusion of the minority carriers (the electrons). The separation of the charge carriers further reduces the recombination rate, in particular at the conductive layer 230. Also, since the upper part of the first amorphous layer has the heaviest doping, good ohmic contact can be achieved with the conductive layer 230.

Figure 2B:
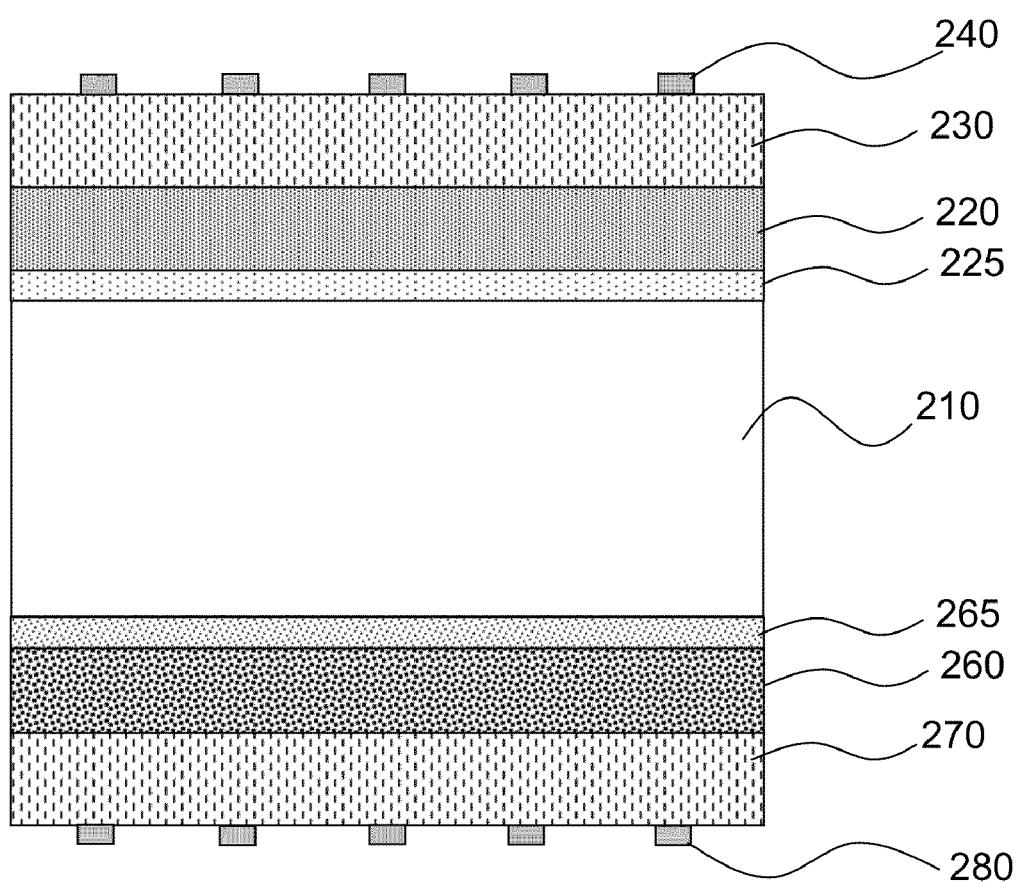
FIG. 2B schematically illustrates a photovoltaic cell structure according to a second embodiment of the invention.

FIG. 2B illustrates the structure of a photovoltaic cell according to a second embodiment of the invention. The parts that are identical to those in FIG. 2A carry the same reference numbers.

This second embodiment differs from the first in that it comprises a microdoped fourth amorphous layer 265, of same type as the third, here an N-doped a-Si layer, that is directly deposited on the back surface of the substrate before the amorphous layer 260. The dopant concentration of the fourth amorphous layer lies between $1.10^{16}$ and $1.10^{18}$ atoms/cm$^3$ and its thickness typically lies between 2 and 4 nm.

Compared with the configuration known in the prior art in which the heavily doped amorphous layer, generating the BSF field, is directly in contact with the back surface, the present structure allows a lower state density to be obtained at the interface with the substrate, in the same way as an intrinsic layer, hence a low recombination rate of the carriers. On the other hand, since the fourth layer has higher conductivity than an intrinsic amorphous layer, the fill factor of the cell comes to be improved.

The lower face of the amorphous layer 260 is coated with a back collecting electrode 280, optionally after depositing a transparent, conductive oxide layer 270 e.g. in ITO. This latter layer may have a thickness of between 75 and 100 nm for example.

According to a first variant of the second embodiment, the dopant concentration is constant in each of the amorphous layers, the dopant concentration in the third amorphous layer being substantially greater than in the fourth amorphous layer directly in contact with the substrate.

According to a second variant of the second embodiment, the dopant concentration is gradual across the fourth and third layers. More precisely, it increases in the direction leading from the fourth amorphous layer 265 towards the third amorphous layer 260. Compared with the first variant, this second variant has the same advantages as those described for the first embodiment, namely more efficient extraction of the majority carriers (here electrons) and repelling back towards the junction of the minority carriers (here the holes) which have diffused in direction of the collecting electrode, hence once again a lower recombination rate of the carriers and a higher value of $V_{co}$.

One example of embodiment of a photovoltaic cell according to the second embodiment is given below.

The substrate used is a wafer of N-type monocrystalline silicon having a thickness of 250 μm and a conductivity of 2 Ω·cm, previously textured, cleaned and deoxidized in HF.

The second and first amorphous silicon layers are successively deposited on a face of the substrate thus prepared. Depositing is conducted by Plasma Enhanced Chemical Vapour Deposition—PECVD. The thickness of the second layer is 3 nm and the thickness of the first layer is 7 nm.

The P-doping of the second amorphous layer (microdoped) performed by placing diborane ($B_2H_6$) in the plasma depositing chamber, is $5.10^{17}$ atoms of boron/cm$^3$, and the $P^+$-doping of the first layer is $3.10^{20}$ atoms of boron/cm$^3$ (mean doping).

On the other face of the substrate, the fourth and third amorphous layers are successively deposited by PECVD. The thickness of the fourth layer is 4 nm and the thickness of the third layer is 20 nm.

The doping of these two layers is performed by placing phosphine ($PH_3$) in the chamber. The doping concentration (constant) of the fourth layer (microdoped) is $1.10^{17}$ atoms/cm$^3$ and the doping of the third layer is $1.10^{20}$ atoms/cm$^3$.

Transparent, conductive layers in ITO are then deposited by cathode sputtering and the collecting electrodes are produced by serigraphy with so-called "low temperature" paste.

The photovoltaic cell thus obtained shows an increase in voltage $V_{co}$ of 50 mV, an increase in current $I_{cc}$ of 1 mA/cm$^2$ and a maintained fill factor value compared with a cell of equivalent thickness but devoid of microdoped layers.

The invention claimed is:

1. A photovoltaic cell comprising:
   a heterojunction between a crystalline semiconductor substrate of a first conductivity type; and
   a first amorphous layer, on a first face of the substrate and in a same semiconductor material as the substrate, said first amorphous layer having a second conductivity type opposite the first conductivity type and a dopant concentration of between $1 \times 10^{19}$ and $1 \times 10^{22}$ atoms/cm$^3$, wherein
   a second face of the substrate opposite the first face is coated with a third amorphous layer in the same semiconductor material as the substrate and of a same conductivity type as the substrate, with a dopant concentration of between $1 \times 10^{19}$ and $1 \times 10^{22}$ atoms/cm$^3$; and
   a second amorphous layer of a same conductivity as the first amorphous layer and having a dopant concentration of between $1 \times 10^{16}$ and $1 \times 10^{18}$ atoms/cm$^3$, said second amorphous layer being deposited directly on the first face of the substrate and being coated with said first amorphous layer.

2. The photovoltaic cell according to claim 1, wherein doping in the first and second amorphous layers is gradual, and the dopant concentration increases in a direction leading from the second amorphous layer towards the first amorphous layer.

3. The photovoltaic cell according to claim 1, wherein the dopant concentration in each of the first and second amorphous layers is constant.

4. The photovoltaic cell according to any one claims 1 to 3, wherein a thickness of the first amorphous layer is less than 50 nm and a thickness of the second amorphous layer is less than 10 nm.

5. The photovoltaic cell according to claim 1, further comprising:
   a fourth amorphous layer, in the same semiconductor material as the substrate and of the same conductivity type as the substrate, said fourth amorphous layer being deposited directly on the second face of the substrate and being coated with said third amorphous layer.

6. The photovoltaic cell according to claim 5, wherein doping within the third and fourth amorphous layers is gradual, the dopant concentration increases in a direction leading from the fourth amorphous layer towards the third amorphous layer.

7. The photovoltaic cell according to claim 5, wherein the dopant concentration in each of the third and fourth amorphous layers is constant.

8. The photovoltaic cell according to any one of claims 5 to 7, wherein a thickness of the third amorphous layer is less than 50 nm and a thickness of the fourth amorphous layer is less than 10 nm.

9. The photovoltaic cell according to claim 1, wherein said first amorphous layer is coated with a first layer of transparent conductive oxide on which first collecting electrodes are arranged.

10. The photovoltaic cell according to claim 9, wherein said third amorphous layer is coated with a second layer of transparent conductive oxide on which second collecting electrodes are arranged.

* * * * *